United States Patent
Zhang et al.

(10) Patent No.: US 10,965,921 B2
(45) Date of Patent: Mar. 30, 2021

(54) STORAGE MEDIUM, ELECTRONIC DEVICE AND IMAGE PROCESSING METHOD

(71) Applicant: GUANGDONG OPPO MOBILE TELECOMMUNICATIONS CORP., LTD., Guangdong (CN)

(72) Inventors: Lei Zhang, Guangdong (CN); Jingyang Sun, Guangdong (CN); Le Yang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 43 days.

(21) Appl. No.: 16/431,502

(22) Filed: Jun. 4, 2019

(65) Prior Publication Data
US 2019/0373229 A1 Dec. 5, 2019

(30) Foreign Application Priority Data

Jun. 4, 2018 (CN) .......................... 201810564121.7
Jun. 4, 2018 (CN) .......................... 201820859848.3

(51) Int. Cl.
*H04N 9/31* (2006.01)
*H04M 1/02* (2006.01)
(Continued)

(52) U.S. Cl.
CPC ......... *H04N 9/3176* (2013.01); *G09G 3/2003* (2013.01); *G09G 3/3225* (2013.01);
(Continued)

(58) Field of Classification Search
CPC .... H04N 5/232; H04N 5/2254; H04N 5/2253; H04N 9/3176; H04M 1/0272;
(Continued)

(56) References Cited

U.S. PATENT DOCUMENTS

| | | | | | |
|---|---|---|---|---|---|
| 5,828,427 | A | * | 10/1998 | Faris | H04N 13/246 349/5 |
| 2009/0278913 | A1 | * | 11/2009 | Rosenfeld | H04N 7/144 348/14.16 |

(Continued)

FOREIGN PATENT DOCUMENTS

| | | |
|---|---|---|
| CN | 106603772 | 4/2017 |
| CN | 206389421 | 8/2017 |

(Continued)

OTHER PUBLICATIONS

WIPO, English Translation of Isrnvo for PCT/CN2019/090036, dated Aug. 8, 2019.
(Continued)

*Primary Examiner* — Lin Ye
*Assistant Examiner* — John H Morehead, III
(74) *Attorney, Agent, or Firm* — Hodgson Russ LLP

(57) ABSTRACT

The present disclosure provides an electronic device, a storage medium, and an image processing method, wherein, the electronic device includes a processing unit, a camera and a display screen covering the camera. Wherein, the display screen includes a light transmission area and a non-light transmission area, is configured to display a first image on the non-light transmission area under the control of the processing unit. The camera is disposed under the light transmission area, includes a projection assembly and an imaging assembly both electrically connected to the processing unit. The projection assembly is configured to project a second image on the display screen under the control of processing unit thereby to display the image on the light transmission area of the display screen, and the imaging assembly is configured to capture a third image through the light transmission area of the display screen.

20 Claims, 5 Drawing Sheets

(51) Int. Cl.
*H04N 5/225* (2006.01)
*H04N 5/232* (2006.01)
*G09G 3/20* (2006.01)
*G09G 3/3225* (2016.01)
*H01L 27/146* (2006.01)
*H01L 27/32* (2006.01)

(52) U.S. Cl.
CPC .... *H01L 27/14621* (2013.01); *H01L 27/3227* (2013.01); *H04M 1/0264* (2013.01); *H04M 1/0272* (2013.01); *H04N 5/2253* (2013.01); *H04N 5/2254* (2013.01); *H04N 5/232* (2013.01); *G09G 2320/0666* (2013.01); *G09G 2370/08* (2013.01)

(58) Field of Classification Search
CPC .............. H04M 1/0264; H04M 1/0266; H01L 27/3227; H01L 27/146221; G09G 3/3225; G09G 3/2003; G09G 2370/08; G09G 2320/0666; G03B 17/54; G03B 21/10; G03B 29/00; G06F 1/1637; G06F 1/1639; G06F 1/1686
See application file for complete search history.

(56) References Cited

U.S. PATENT DOCUMENTS

2012/0287327 A1* 11/2012 Border ............... G03B 15/10
　　　　　　　　　　　　　　　　　　348/333.09
2013/0135499 A1* 5/2013 Song ............... H04N 5/23245
　　　　　　　　　　　　　　　　　　348/240.99
2017/0372668 A1　12/2017 Yashiki

FOREIGN PATENT DOCUMENTS

| | | |
|---|---|---|
| CN | 107580092 | 1/2018 |
| CN | 107658332 | 2/2018 |
| CN | 107682489 | 2/2018 |
| CN | 107707695 | 2/2018 |
| CN | 108551505 | 9/2018 |
| CN | 108566506 | 9/2018 |
| CN | 108632417 | 10/2018 |
| CN | 208386637 | 1/2019 |
| CN | 208386639 | 1/2019 |
| CN | 208386727 | 1/2019 |
| CN | 208386728 | 1/2019 |
| GB | 2552090 | 1/2018 |

OTHER PUBLICATIONS

EPO, Office Action for EP Application No. 19178154.1, dated Oct. 10, 2019.
IP India, First Office Action for IN 201914022167, dated Nov. 24, 2020.

* cited by examiner

STORAGE MEDIUM, ELECTRONIC DEVICE AND IMAGE PROCESSING METHOD

CROSS-REFERENCE TO RELATED APPLICATION

This application claims priority to Chinese Patent Application No. 201810564121.7, filed Jun. 4, 2018, and Chinese Patent Application No. 201820859848.3, filed Jun. 4, 2018. The entire disclosures of the aforementioned applications are incorporated herein by reference.

TECHNICAL FIELD

The present disclosure relates to mobile terminals, and particularly to a storage medium, an electronic device, and an image processing method.

BACKGROUND

With the development of mobile terminal, a front camera is disposed in a mobile terminal, and generally disposed under the display screen of the mobile terminal. Because demand for the screen size is increasing, screen-to-body ratio of the mobile terminals is higher in the same size, and the screen display of the mobile terminal is gradually become full display screen.

In the related art, for a mobile terminal with full screen, a portion of the full screen is hollowed out or transparent and the front camera is disposed under the portion to realize the shooting function of the front camera. However, an image cannot be captured at the same time as a full screen image is being displayed.

SUMMARY

The present disclosure aims to solve at least one of the technical problems in the related art to some extent.

Therefore, the present disclosure provides an electronic device including a processing unit, a camera and a display screen covering the camera. The camera includes a projection assembly and an imaging assembly, so that the camera can project a second image under the control of the processing unit in a display state, and can capture third images in an imaging state. The coexistence of the full screen display function and the image acquisition function is realized, and the screen-to-body ratio in the electronic device is truly maximized.

The present disclosure provides an image processing method.

The present disclosure provides another electronic device.

The present disclosure provides a computer readable storage medium.

In a first aspect, the embodiment of the present disclosure provides an electronic device, including a processing unit, a camera, and a display screen covering the camera.

Wherein the display screen is electrically connected to the processing unit. The display screen includes a light transmission area and a non-light transmission area, and is configured to display a first image on the non-light transmission area under the control of the processing unit.

The camera is disposed under the light transmission area correspondingly, and includes a projection assembly electrically connected to the processing unit and an imaging assembly electrically connected to the processing unit. The projection assembly is configured to project a second image on the display screen under the control of the processing unit, thereby displaying the second image on the light transmission area of the display screen. The imaging assembly is also configured to capture a third image through the light transmission area of the display screen under the control of the processing unit.

The processing unit is configured to control the display screen to display a first image, and is also configured to control the camera to project a second image in a display state and to capture a third image in an imaging state.

In a second aspect, the embodiment of the present disclosure provides an image processing method, including:

controlling the camera in a display state or in an imaging state;

controlling the camera to project the second image when the camera is in the display state; and controlling the camera to capture a third image when the camera is in the imaging state.

In a third aspect, the embodiment of the present disclosure provides an electronic device, including a memory, a processor, and a computer program stored in the memory and can be executed by the processor. The image processing method as described in the second aspect embodiment is implemented when the processor executes the program.

In a fourth aspect, the embodiment of the present disclosure provides a computer readable storage medium with the computer program stored therein. When the program is executed by the processor, the image processing method as described in the second aspect embodiment is implemented.

BRIEF DESCRIPTION OF THE DRAWINGS

The above described and/or additional aspects and advantages of the present disclosure will become apparent and readily understood, wherein.

DETAILED DESCRIPTION OF EMBODIMENTS

Figure 1:
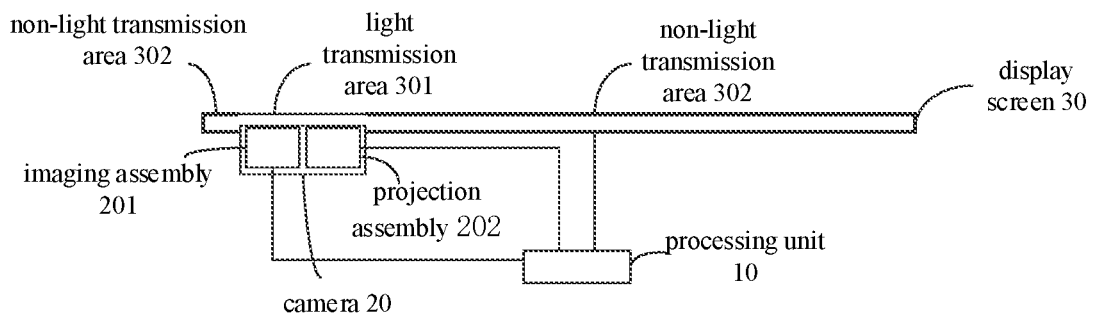
FIG. 1 is a schematic structural view of an electronic device according to an embodiment of the present disclosure.

The embodiments of the present disclosure are described in detail below, and the examples of the embodiments are illustrated in the drawings, wherein the same or similar reference numerals are used to refer to the same or similar elements or elements having the same or similar functions.

The embodiments described below with reference to the accompanying drawings are intended to be illustrative, and are not to be construed as limitations to the disclosure.

Technologies of full screen are used in electronic devices more and more. Currently, for electronic devices equipped with front cameras, solutions of full screen are as follows.

In a first solution, a transparent area corresponding to a camera is set on a full screen. The solution causes the area corresponding to the camera on the full screen cannot display an image.

In a second solution, the full screen is made into a special-shaped screen to leave a space corresponding to the camera. In this solution, the full screen is poor in appearance, the screen utilization around the camera is low, the screen size is wasted, and the high ratio of the full screen is not realized.

In order to solve the above problems, the present disclosure provides an electronic device, through disposing a projection assembly and an imaging assembly in the electronic device to realize a full screen solution in the electronic device. A display function and an image capturing function can be coexisted in the area corresponding to the camera, the electronic device has nice appearance, and realizes a maximization full screen ratio in the electronic device.

The electronic device, and an image processing method and device provided by embodiments of the present disclosure are described below with reference to the accompanying drawing.

FIG. 1 is a schematic structural view of an electronic device according an embodiment of the present disclosure. The electronic device may include a mobile terminal or a desktop terminal, such as a mobile phone, an iPad, a palmtop computer, a desktop computer, and the like.

As illustrated in FIG. 1, the electronic device may include a processing unit 10, a camera 20 and a display screen 30 covering the camera 20.

The display screen 30 is electrically connected to the processing unit 10. The display screen 30 may include a light transmission area 301 and a non-light transmission area 302, and the display screen 30 may be configured to display a first image on the non-light transmission area 302 under the control of the processing unit 10. Wherein, the light transmission area 301 may be rectangular, circular, or other shapes, and is not limited in this embodiment. In addition, for the position of the light transmission area 301, the person having ordinary skill in the art can freely dispose the light transmission area 301 in different position of the display screen 300 according to the requirements of the product, it is not limited in this embodiment.

The camera 20 is correspondingly disposed under the light transmission area 301, and includes a projection assembly 202 electrically connected to the processing unit 10 and an imaging assembly 201 electrically connected to the processing unit 10. Under the control of processing unit 10, the projection assembly 202 is configured to project a second image on the display screen 30 thereby to be displayed on the light transmission area 301 of the display screen 30. The imaging assembly 201 is also configured to capture a third image through the light transmission area 301 of the display screen 30 under the control of the processing unit 10.

The processing unit 10 is configured to control the display screen 30 to display the first image, and control the camera 20 to project the second image in a display state and to capture the third image in an imaging state.

In the electronic device according to the embodiment of the present disclosure, the display screen is electrically connected to the processing unit, and the display screen includes the light transmission area and the non-light transmission area. The camera is disposed under the light transmission area, includes a projection assembly electrically connected to the processing unit and an imaging assembly electrically connected to the processing unit, and is configured to project the second image to the display screen by the projection assembly under the control of processing unit, so as to be displayed on the light transmission area of the display screen, and also is configured to capture the third image through the light transmission area of the display screen by the imaging assembly under the control of the processing unit. The processing unit is configured to control the display screen to display the first image, and control the camera to project the second image in the display state and to capture the third image in the imaging state. By setting the projection assembly and the imaging assembly in the camera, in the display state, the projection assembly can project the second image on the display screen under the control of the processing unit, so that the light transmission area of the display screen can also display the first image, thereby full screen display can be realized; in the imaging state, the imaging assembly can capture the third image through the control of the processor, so that the image capturing function can be realized, the full screen display and the image capturing function of the electronic device can coexist, and the ratio of the full screen in the electronic device is maximized.

Figure 2:
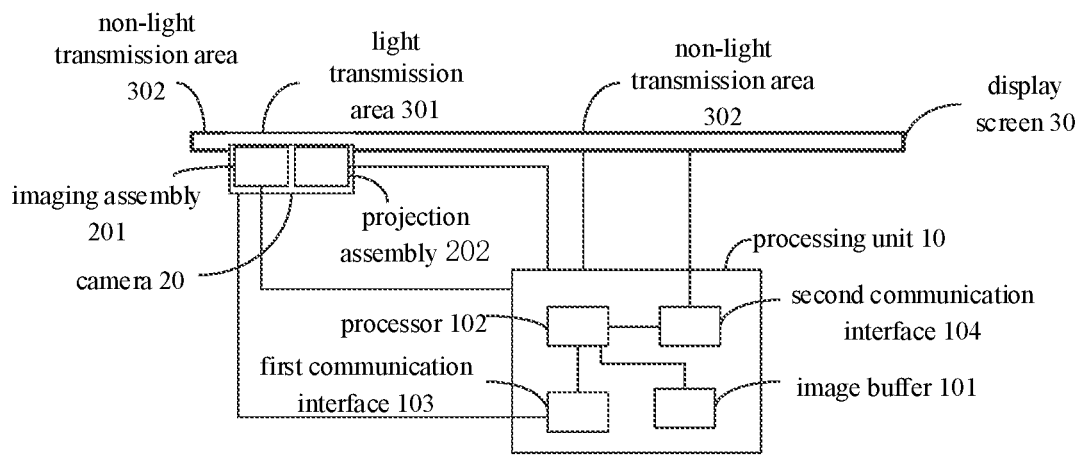
FIG. 2 is a schematic structural view of another electronic device according to an embodiment of the present disclosure.

Based on the foregoing embodiment, the embodiment of the present disclosure provides another possible implementation of another electronic device, and FIG. 2 is a schematic structural view of the another electronic device according an embodiment of the present disclosure.

As shown in FIG. 2, the processing unit 10 may include an image buffer 101, a processor 102, a first communication interface 103 electrically connected to the camera 20, and a second communication interface 104 electrically connected to the display screen 30.

The image buffer 101 is configured to separately buffer a display sub-image and a projection sub-image divided from a fourth image. The fourth image is configured to be displayed on the display screen, wherein the display sub-image is configured to displayed on the non-light transmission area and the projection sub-image is configured to be projected on the light transmission area by the camera to be displayed on the light transmission area.

The processor 102, is electrically connected to the image buffer 101, and is configured to read the image buffer 101 to obtain the display sub-image and the projection sub-image, and to transmit the projection sub-image to the first communication interface 103 and to transmit the display sub-image to the second communication interface 104.

The first communication interface 103, is electrically connected to the processor 102, and is configured to transmit the projection sub-image as the second image to the camera 20. That is, the projection sub-image is projected as the second image on the light transmission area, or the projection sub-image is the second image. The second communication interface 104, is electrically connected to the processor 102, and is configured to transmit the display sub-image as the first image to the display screen 30. That is, the display sub-image is displayed as the first image on the non-light transmission area, or the display sub-image is the first image. As a possible embodiment, the first communication interface 103 and the second communication interface 104 are display serial interfaces (DSIs) for synchronous transmission. In the display state, the projection sub-image transmitted to the camera 20 by the first communication interface 103 and the display sub-image transmitted to the display screen 30 by the second communication interface 104 can be transmitted synchronously, through the DSIs for synchronous transmission, thereby the projection sub-image and the display sub-image are displayed in the display screen 30 synchronously.

Figure 3:
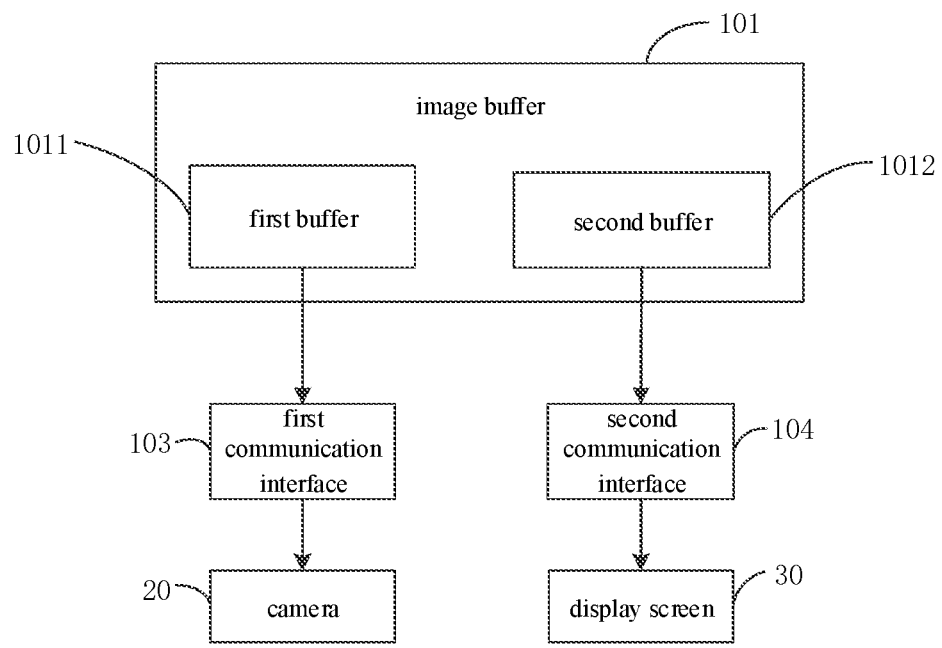
FIG. 3 is a schematic view showing data flow in an image buffer according to an embodiment of the present disclosure.

As a possible embodiment, the image buffer 101 may include a first buffer 1011 and a second buffer 1012, wherein the first buffer 1011 is configured to store the projection sub-image, and the second buffer 1012 is configured to store the display sub-image. FIG. 3 is a schematic view showing data flow in the image buffer according to an embodiment of the present disclosure. As shown in FIG. 3, by dividing different buffer areas, image information corresponding to image pixels in the non-light transmission area of the display screen, that is, the display sub-image, is stored in the first buffer 1011; image information corresponding to image pixels in the light transmission area of the display screen, that is, the projection sub-image, is stored in the second buffer 1012. As such, a corresponding relationship between the storage location and the fourth image in the display screen display area is established. So, when the camera is in the display state, the processor 10 can directly read the projection sub-image from the first buffer 1011 of the image buffer 101, transmit the projection sub-image through the first communication interface 103 to the camera 20 and further to be projected, and read the display sub-image from the second buffer 1012 and transmit the display sub-image through the second communication interface 104 to the display screen 30 to be displayed, thereby improving the efficiency of full screen display.

Figure 4:
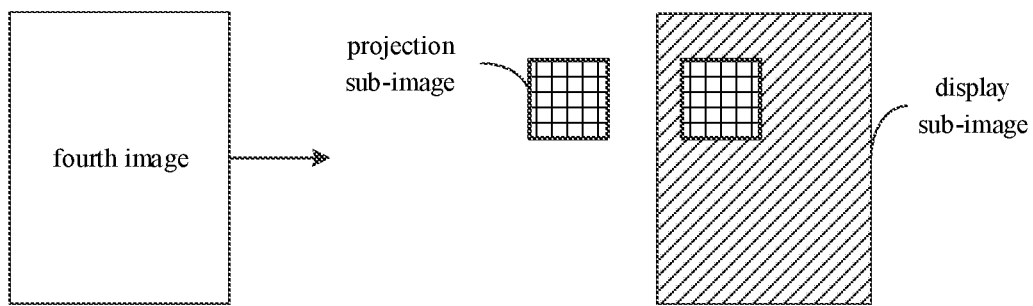
FIG. 4 is a first schematic view of a division of sub-images according to an embodiment of the present disclosure.
Figure 5:
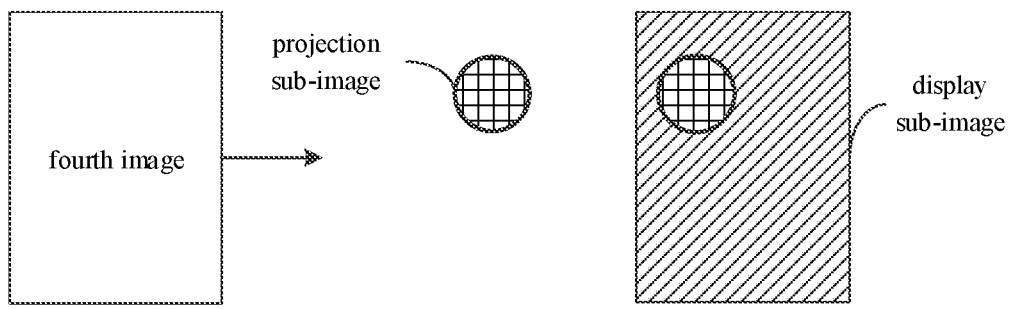
FIG. 5 is a second schematic view of a division of sub-images according to an embodiment of the present disclosure.

The projection sub-image and the display sub-image stored in the image buffer 101 are obtained by dividing the fourth image, and the fourth image may be divided according to an image shape corresponding to the image pixels corresponding to the non-light transmission area 302 of the display screen 30 and an image shape corresponding to the image pixels corresponding to the light transmission area 301 of the display screen 30. As a possible embodiment of division, FIG. 4 is a schematic view of a division of sub-images according to an embodiment of the present disclosure. As illustrated in FIG. 4, the image corresponding to the image pixels of the light transmission area 301 of the display screen 30 is square, so that the fourth image can be divided according to the shape of the images corresponding to the image pixels corresponding to the light transmission 301 and the non-light transmission area 302 of the display screen 30, thereby to obtain the projection sub-image and the display sub-image as illustrated on right side of FIG. 4. As another possible embodiment of division, FIG. 5 is another schematic view of a division of sub-images according to an embodiment of the present disclosure. As illustrated in FIG. 5, the shape of the images corresponding to the image pixels of the light transmission area 301 of the display screen 30 is circular, so that the fourth image can be divided according to the shape of the images corresponding to the image pixels corresponding to the light transmission 301 and the non-light transmission area 302 of the display screen 30, thereby to obtain the projection sub-image and the display sub-image as illustrated on right side of FIG. 5. It should be noted that, FIG. 4 and FIG. 5 just show two kinds of division of the projection sub-image and the display sub-image according to the images corresponding to the image pixels of the light transmission area 301 and the non-light transmission area 302 of the display screen 30. In actual applications, a person skilled in the art may divide the fourth image according to the image shapes corresponding to the image pixels of the light transmission area 301 and the non-light transmission area 302 of the display screen 30, with a similar division principle, and more examples are not enumerated in this embodiment.

In the electronic device of the embodiment of the present disclosure, by setting the projection assembly and the imaging assembly in the camera, in the display state, the projection assembly can project the projection sub-image to the display screen under the control of the processing unit, so that the light transmission area of the display screen can also display the display sub-image, thereby full screen display can be realized; in the imaging state, the imaging assembly can capture the third image under the control of the processor, so that the image capturing function can be realized, the full screen display and the image capturing function of the electronic device can coexist, and the ratio of the full screen in the electronic device is truly maximized and realized. In addition, in the display state, the projection sub-image transmitted to the camera by the first communication interface and the display sub-image transmitted to the display screen by the second communication interface can be transmitted synchronously, through the DSIs for synchronous transmission, thereby the projection sub-image and the display sub-image can be displayed in the display screen synchronously.

Figure 6:
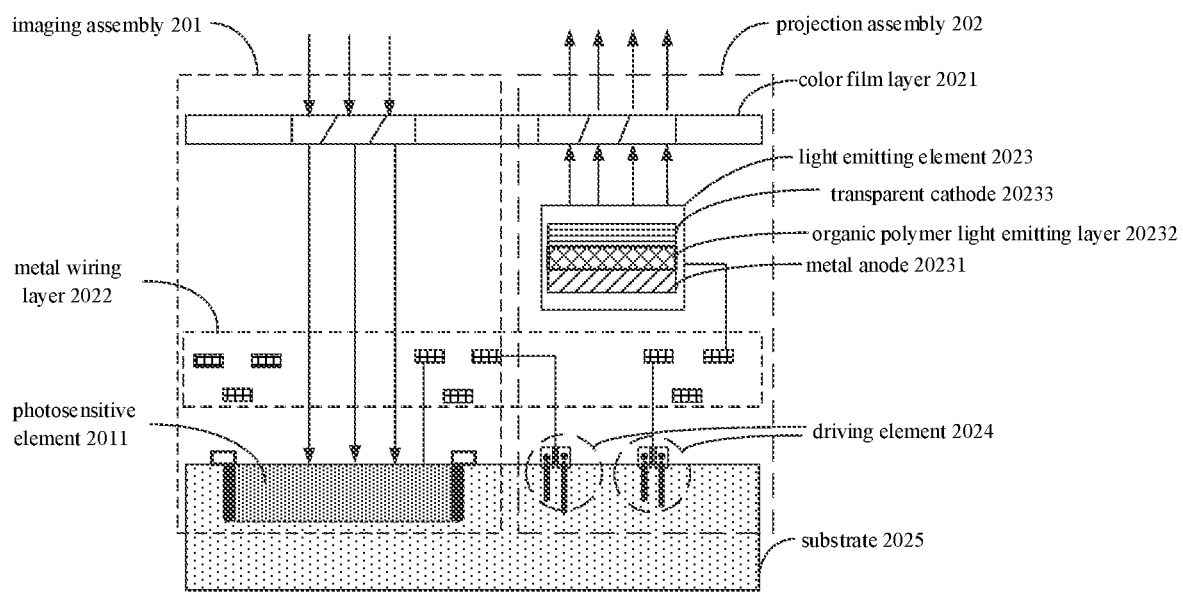
FIG. 6 is a schematic structural view of still another electronic device according to an embodiment of the present disclosure.

Based on the above embodiments, an additional electronic device is provided in an embodiment of the present disclosure. FIG. 6 is a schematic structural view of the additional electronic device according to an embodiment of the present disclosure. As shown in FIG. 6, based on the previous embodiment, a projection assembly 202 includes a color film layer 2021, a metal wiring layer 2022, a light emitting element 2023, and a driving element 2024.

The driving element 2024 is disposed on a surface of a substrate 2025, and is configured to drive the light emitting element 2023.

The metal wiring layer 2022 is disposed on a surface of the driving element 2024, and is electrically connected to the driving element 2024 and the light emitting element 2023.

The light emitting element 2023 is disposed on a surface of the metal wiring layer 2022, and is configured to emit light under the driving of the driving element 2024.

The color film layer 2021 is disposed on a surface of the light emitting element 2023, and is configured to filter lights.

As a possible embodiment, the light emitting element 2023 may further include a metal anode 20231, an organic polymer light emitting layer 20232, and a transparent cathode 20233.

The metal anode 20231 is disposed on the surface of the metal wiring layer 2022.

The organic polymer light emitting layer 20232 is disposed on a surface of the metal anode 20231.

The transparent cathode 20233 is disposed on a surface of the organic polymer light emitting layer 20232.

As a possible embodiment, an imaging assembly 201 and the projection assembly 202 share the same substrate 2025. The imaging assembly 201 includes a photosensitive element 2011, the metal wiring layer 2022 shared with the projection assembly 202, and the color film layer 2021 shared with the projection assembly 202.

The photosensitive element 2011 is disposed on the surface of the substrate 2025, is configured to detect the light filtered by the color film layer 2021, and is electrically connected to the metal wiring layer 2022.

Figure 7:
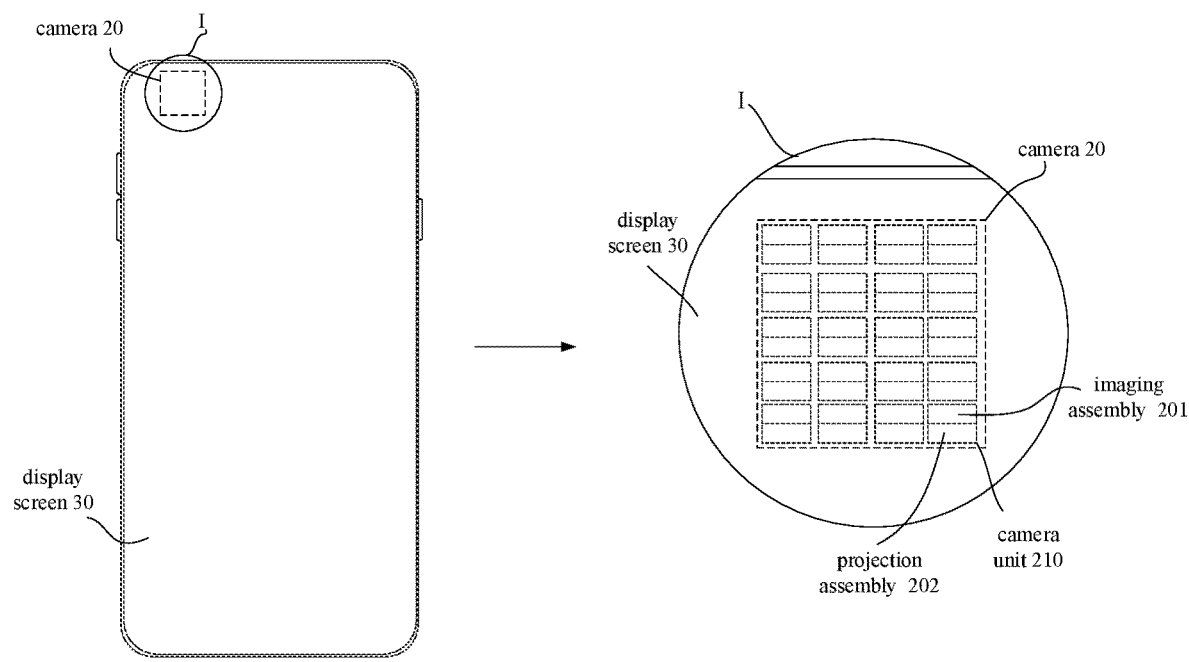
FIG. 7 is an enlarged schematic view of the camera in the electronic device according to an embodiment of the present disclosure.
Figure 8:
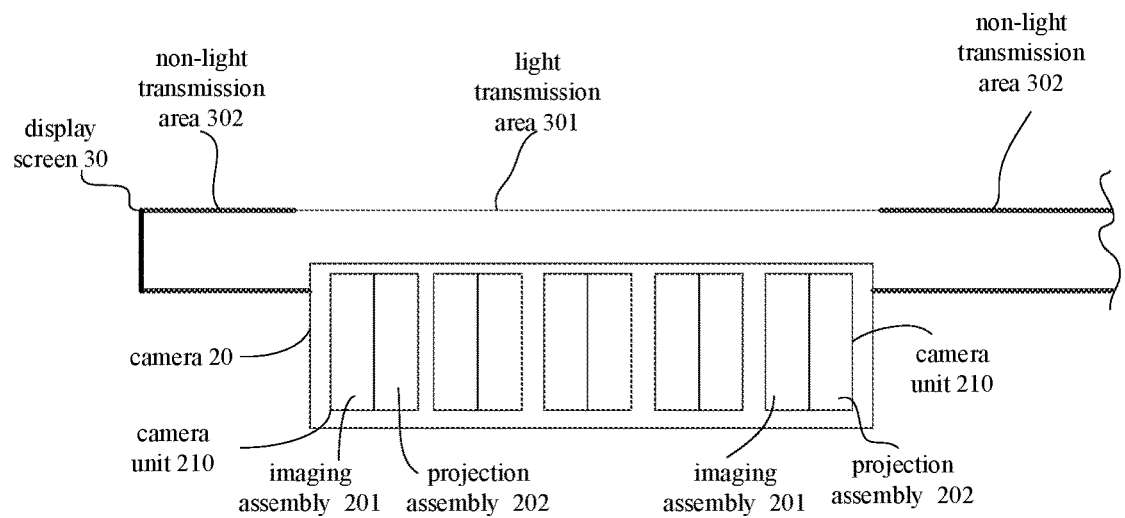
FIG. 8 is a schematic structural view of still another electronic device according to an embodiment of the present disclosure.

Optionally, as shown in FIG. 7, in some embodiments of the disclosure, the camera 20 may include a plurality of arrayed camera units 210. Each camera unit 210 includes at least one projection assembly 202 and at least one imaging assembly 201, the projection assembly 202 and the imaging assembly 201 are adjacent. Correspondingly, the plurality of camera units 210 include a plurality of projection assemblies 202 and a plurality of imaging assemblies 201. As shown in FIG. 8, the camera 30 is disposed under the light transmission area 301, each projection assembly 202 is configured to project one pixel of the second image on the light transmission area 301, so that the plurality of projection assemblies 202 can project the second image on the light transmission area 301. Each imaging assembly 201 is configured to capture one pixel of the third image, so that the plurality of imaging assemblies 201 can capture the third image through the light transmission area 301.

In a possible scene, when the electronic device is in the display state, the projection assembly 202 is activated to project the second image. There may be a plurality of projection assemblies 202, each projection assembly 202 corresponds to one pixel of the second image, and the pixel of the second image is determined according to the second image. For convenience of description, one projection assembly is taken as an example for description in the embodiment. Specifically, as shown in FIG. 6, in the projection assembly 202, a voltage is applied to the light emitting element 2023 under the driving signal of the driving element 2024. For example, the light emitting element 2023 may be an organic light-emitting diode (OLED), and the current flows from the transparent cathode 20233 to the metal anode 20231 and passes through the organic polymer light emitting layer 20232. That is, the transparent cathode 20233 outputs electrons to the organic polymer light emitting layer 20232, the metal anode 20231 outputs holes to the organic polymer light emitting layer 20232, the electrons will combine with the holes in the organic polymer light emitting layer 20232 when the electrons reach the organic polymer light emitting layer 20232. The electron is negatively charged and the hole is positively charged, and they attract each other to excite organic materials of the organic polymer light emitting layer 20232 to emit, thereby realizing the light emission of the light emitting element 2023. Further, the light can be filtered when passes through the color film layer 2021 to generate three primary colors of red, green, and blue, and different filtering requirements can be realized according to the color setting of the filter of the color film layer 2021, thereby the display of the second image can be realized.

In another possible scene, when the electronic device is in the imaging state, the imaging assembly 201 can be activated to capture the third image. There may be a plurality of imaging assemblies 201, each imaging assembly 202 corresponds to one pixel of the third image, and the pixel of the third image is configured to generate the third image. For convenience of description, one imaging assembly is taken as an example for description in the embodiment. Specifically, as shown in FIG. 6, light can be filtered when passes through the color film layer 2021, the photosensitive element 2011 is configured to detect the light filtered by the color film layer 2021, so that the photosensitive element 2011 to transfer the detected light from optical information to digital signal, thereby the R, G, and B value of the pixel of the third image corresponding to the imaging assembly 201 can be determined, that is, the third image can be determined, and the third image can be generated according to the pixels corresponding to a plurality of imaging assemblies 201.

In the electronic device of the embodiment of the present disclosure, the camera include a plurality of camera units, and each camera unit include at least one projection assembly and at least one imaging assembly. In the display state, the projection assembly can project to the display screen under the control of the processing unit, so that the light transmission area of the display screen can also display the first image, thereby full screen display can be realized; in the imaging state, the imaging assembly can capture the third image in the control of the processor, so that the image capture function can be realized, the full screen display and the image capture of the electronic device can coexist. And, in the display state, the projection sub-image transmitted to the camera by the first communication interface and the display sub-image transmitted to the display screen by the second communication interface can be transmitted synchronously, through the DSIs for synchronous transmission, thereby the projection sub-image and the display sub-image displayed in the display screen can be displayed synchronous. In addition, by setting the projection assembly and the imaging assembly in the camera and sharing components, the size of the camera is prevented from being excessively large, thereby the overall size of the electronic device can be reduced, and the cost can be reduced.

Figure 9:
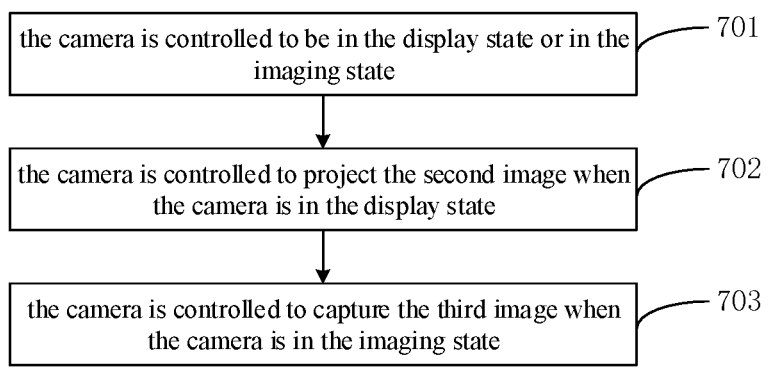
FIG. 9 is a schematic flowchart view of the image processing method according to an embodiment of the present disclosure.

Based on the above embodiments, the embodiment of the present disclosure further provides an image processing method. FIG. 9 is a schematic flowchart of the image processing method according to an embodiment of the present disclosure, and the method can be specifically performed by the processor of the electronic device described above. As shown in FIG. 9, the method includes the following blocks.

In block 701, the camera is controlled to be in the display state or in the imaging state.

Specifically, the processing unit controls the camera to be in the display state when the display screen needs to be displayed, and the processing unit controls the camera to be in the imaging state when the camera needs to capture an image.

In block 702, the camera is controlled to project the second image when the camera is in the display state.

Specifically, when the camera is in the display state, the processing unit obtains the fourth image, divides the fourth image into the display sub-image and the projection sub-image, and transmits the display sub-image to the display screen, transmits the projection sub-image to the camera.

In block 703, the camera is controlled to capture the third image when the camera is in the imaging state.

In the image processing method of the embodiment provided by the present disclosure, the camera can be controlled to be in the imaging state or the display state. The camera can be controlled to project the second image when the camera is in the projection state, and the camera can be controlled to capture the third image when the camera is in the imaging state, thereby the coexistence of the full screen display and the image capture in the electronic device is realized, and the screen-to-body ratio in the electronic device is truly maximized.

Figure 10:
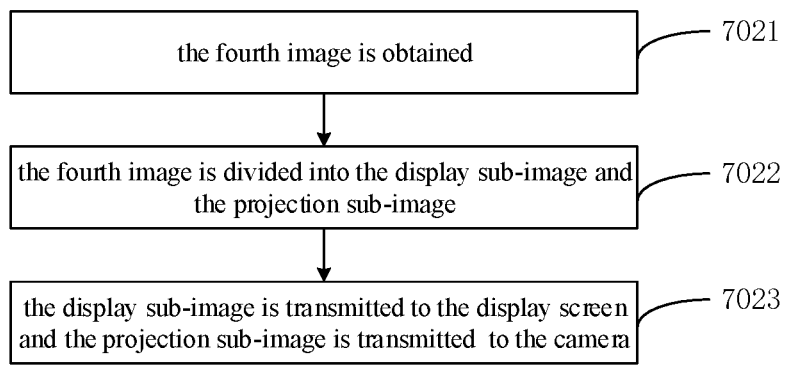
FIG. 10 is a schematic flowchart view of another image processing method according to an embodiment of the present disclosure.

Based on the above embodiments, the embodiment of the present disclosure further provides another image processing method. FIG. 10 is another schematic flowchart of another image processing method according to an embodiment of the present disclosure. As shown in FIG. 10, based on the above embodiments, the block 702 may further include the following blocks.

In block 7021, the fourth image is obtained.

Specifically, the processor reads the fourth image from the image buffer.

In block 7022, the fourth image is divided into the display sub-image and the projection sub-image.

Specifically, the image buffer is divided into the first buffer and the second buffer, the first buffer is configured to store the projection sub-image, and the second buffer is configured to store the display sub-image. When buffering the fourth image in the image buffer, the fourth image is divided into the display sub-image and the projection sub-image, and the display sub-image is buffered in the second buffer and the projection sub-image buffered in the first buffer. When the camera is in the display state, the processor determines the display sub-image from the fourth image according to the image pixels corresponding to the non-light transmission area of the display screen, and the processor determines the projection sub-image from the fourth image according to the image pixels corresponding to the light transmission area of the display screen.

In block 7023, the display sub-image is transmitted to the display screen and the projection sub-image is transmitted to the camera.

Specifically, the display sub-image is carried by a first transmission signal, and the projection sub-image is carried by a second transmission signal. The processor synchronizes the first transmission signal of the display screen and the second transmission signal of the camera, and after the synchronization, transmits the synchronized first transmission signal to the display screen and transmits the synchronized second transmission signal to the camera. As a possible embodiment, the first transmission signal and the second transmission signal can be synchronized by the DSI for synchronous transmission, and after the synchronization, the synchronized first transmission signal can be transmitted to the display screen and the synchronized second transmission signal can be transmitted to the camera after synchronization.

In the image processing method provided by the embodiments of the present disclosure, the camera is controlled to project the second image when the camera is in the display state, the camera is controlled to capture the third image when the camera is in the imaging state, so that the coexistence of the full screen display and the image capture function of the electronic device can be realized. Simultaneously, the image buffer is divided into storage units corresponding to the display sub-image and the projection sub-image, and when the camera is in the display state, the first transmission signal carrying the display sub-image and the second transmission signal carrying the projection sub-image are synchronized, and transmitted to the corresponding display screen and camera. The image displayed on the light transmission area of the display screen corresponding to the camera and the image displayed on the non-light transmission corresponding the display area of the display screen are completely synchronized, thereby the poor user experience caused by the image display being out of sync is avoided.

In order to implement the above embodiments, the present disclosure also provides an image processing device.

Figure 11:
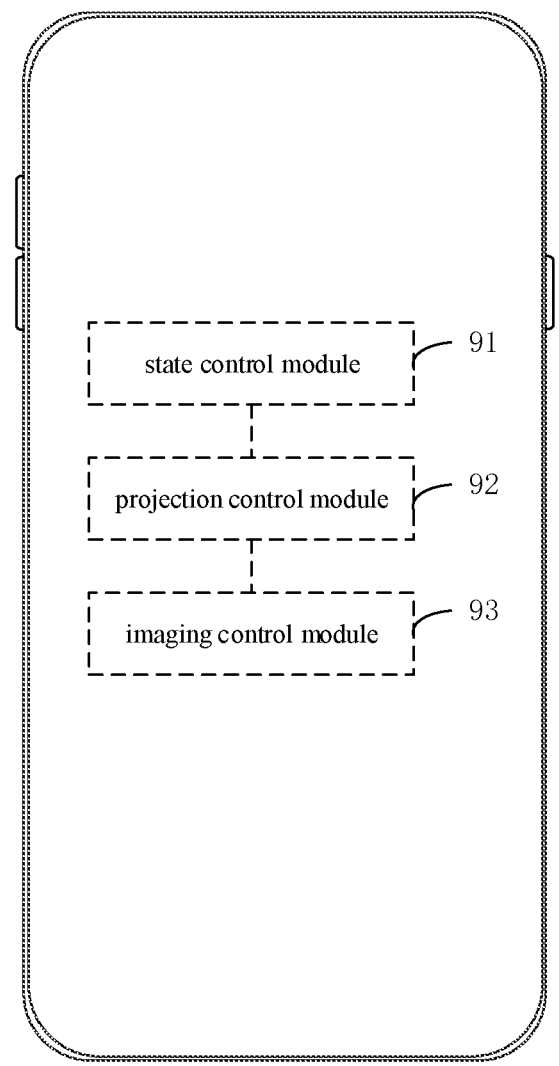
FIG. 11 is a schematic structural view of an image processing device according to an embodiment of the present disclosure.

FIG. 11 is a schematic structural view of the image processing device according to an embodiment of the present disclosure.

As shown in FIG. 11, the device includes a state control module 91, a projection control module 92 and an imaging control module 93.

The state control module 91 is configured to control the camera in the display state or in the imaging state.

The projection control module 92 is configured to control the camera to project the second image when the camera is in the display state.

The imaging control module 93 is configured to control the camera to capture the third image when the camera is in the imaging state.

Further, in a possible embodiment of the present disclosure, the projection control module 92 may further include an obtaining unit, a dividing unit and a transmitting unit.

The obtaining unit is configured to obtain the fourth image.

The dividing unit is configured to divide the fourth image into the display sub-image and the projection sub-image.

The transmitting unit is configured to transmit the display sub-image to the display screen and transmit the projection sub-image to the camera.

In a possible embodiment, the dividing unit is specifically configured to:

determine the display sub-image from the fourth image according to the image pixels corresponding to the non-light transmission area of the display screen;

and determine the projection sub-image from the fourth image according to the image pixels corresponding to the light transmission area projected by the camera.

In a possible embodiment, the transmitting unit is specifically configured to:

synchronize the first transmission signal of the display screen and the second transmission signal of the camera, wherein the first transmission signal carries the display sub-image, and the second transmission signal carries the projection sub-image, transmit the synchronized first transmission signal to the display screen, and transmit the synchronized second transmission signal to the camera.

It should be noted that the foregoing description of the method embodiments is also applicable to the device of the embodiments, and the implementation principles are similar, and details are not described herein again.

In the image processing device provided by the embodiments of the present disclosure, the camera is controlled to project the second image when the camera is in the display state, the camera is controlled to capture the third image when the camera is in the imaging state, so that the coexistence of the full screen display and the image capture function of the electronic device can be realized. Simultaneously, the image buffer is divided into storage units corresponding to the display sub-image and the projection sub-image, and when the camera is in the display state, the first transmission signal carrying the display sub-image and the second transmission signal carrying the projection sub-image are synchronized, and transmitted to the corresponding display screen and camera. The image displayed on the light transmission area of the display screen corresponding to the camera and the image displayed on the non-light transmission corresponding the display area of the display screen are completely synchronized, thereby the poor user experience caused by the image display being out of sync is avoided.

In order to implement the above embodiments, the present disclosure also proposes an electronic device including a memory, the processor, and a computer program stored in the memory and executable in the processor, and the image processing method as described in the foregoing method embodiments is implemented when the processor executes the computer program.

In order to implement the above embodiments, the present disclosure also proposes a computer readable storage medium, stored a computer program, and the image processing method as described in the foregoing method embodiment is implemented when the program is executed by the processor.

In the description of the present specification, the description with reference to the terms "one embodiment", "some embodiments", "example", "specific example", or "some examples" and the like means a specific feature, a structure, material or characteristic included in at least one embodiment or example of the disclosure described in connection with the embodiment or example. In the present specification, the schematic representation of the above terms is not necessarily directed to the same embodiment or example. Furthermore, the specific feature, the structure, the material, or the characteristic described may be combined in a suitable manner in any one or more embodiments or examples. In addition, various embodiments or examples and features of various embodiments or examples described in the specification may be combined without contradicting each other.

Moreover, the terms "first" and "second" are used for descriptive purposes only and are not to be construed as indicating or implying a relative importance or implicitly indicating the number of technical features indicated. Thus, features defining "first" and "second" may include at least one of the features, either explicitly or implicitly. In the description of the present disclosure, the meaning of "a plurality" is at least two, such as two, three, etc., unless specifically defined otherwise.

Any process or method description in the flowcharts or otherwise described herein may be understood to represent comprising one or more module, segment or portion of code executable instructions for implementing the steps or processes of a custom logic function. And the scope of the preferred embodiments of the present disclosure includes additional implementations, which may not be in the order shown or discussed, and may include performing functions in a substantially simultaneous manner or in the reverse order depending on the functions involved. This should be understood by those skilled in the art to which the embodiments of the present disclosure pertain.

The logic and/or steps represented in the flowchart or otherwise described herein, for example, may be considered as an ordered list of executable instructions for implementing logical functions, and may be embodied in any computer readable medium, used in an instruction execution system, apparatus, or device (e.g., a computer-based system, a system including a processor, or other system that can fetch instructions and execute instructions from an instruction execution system, apparatus, or device), or used in conjunction with such instruction execution systems, devices, or devices. For the purposes of this specification, the "computer readable medium" can be any apparatus that can contain, store, communicate, propagate, or transport a program for use in an instruction execution system, an apparatus, or a device, or in conjunction with the instruction execution system, the apparatus, or the device. More specific examples (non-exhaustive list) of computer readable medium include the following: electrical connections (electronic devices) having one or more wires, portable computer disk cartridges (magnetic devices), random access memory (RAM), read only memory (ROM), erasable programmable read only memory (EPROM or flash memory), fiber optic devices, and portable compact disk read only memory (CDROM). In addition, the computer readable medium may even be a paper or other suitable medium on which the program can be printed, as the paper or other suitable medium may be optically scanned, processed to obtain the program electronically by editing, interpretation or, if appropriate, other suitable method, and then the program can be stored in a computer memory.

It should be understood that portions of the disclosure can be implemented in hardware, software, firmware, or a combination thereof. In the above-described embodiments, multiple steps or methods may be implemented in software or firmware stored in a memory and executed by a suitable instruction execution system. For example, if implemented in hardware and as in another embodiment, it can be implemented by any one or combination of the following techniques well known in the art: discrete logic circuits with logic gates for implementing logic functions on data signals, specific integrated circuits with suitable combinational logic gates, programmable gate array (PGA), field programmable gate arrays (FPGA), and the like.

ordinary skill in the art can understand that all or part of the steps carried by the method of implementing the above embodiments can be completed by a program to instruct related hardware, and the program can be stored in a computer readable storage medium, and when the program executed, the program may include one or a combination of the steps of the method embodiments.

In addition, each functional unit in each embodiment of the present disclosure may be integrated into one processing module, or each unit may exist physically separately, or two or more units may be integrated into one module. The above integrated modules can be implemented in the form of hardware or in the form of software functional modules. The integrated modules, if implemented in the form of software functional modules and sold or used as stand-alone products, may also be stored in a computer readable storage medium.

The storage medium above mentioned may be a read only memory, a magnetic disk or an optical disk or the like. While the embodiments of the present disclosure have been shown and described above, it is understood that the above-described embodiments are illustrative and are not to be construed as limiting the scope of the present disclosure. Variations, modifications, alterations and variations of the above-described embodiments may be made by those skilled in the art within the scope of the present disclosure.

What is claimed is:

1. An electronic device, comprising a processing unit, a camera, and a display screen covering the camera;
wherein the display screen is electrically connected to the processing unit, the display screen comprises a light transmission area and a non-light transmission area, and is configured to display a first image on the non-light transmission area under the control of the processing unit;
wherein the camera is disposed under the light transmission area and comprises a projection assembly and an imaging assembly both electrically connected to the processing unit, the projection assembly is configured to project a second image on the display screen thereby to display the second image on the light transmission area of the display screen under the control of the processing unit, and the imaging assembly is configured to capture a third image through the light transmission area of the display screen under the control of the processing unit; and wherein the processing unit is configured to control the display screen to display the first image, and is configured to control the camera to project the second image in a display state and to capture the third image in an imaging state; the processing unit comprises an image buffer, a processor, a first communication interface electrically connected to the camera, and a second communication interface electrically connected to the display screen; the image buffer is configured to separately buffer a display sub-image and a projection sub-image obtained by dividing a fourth image;

wherein the processor is electrically connected to the image buffer; the processor is configured to read the image buffer to obtain the display sub-image and the projection sub-image, and transmit the projection sub-image to the first communication interface and transmit the display sub-image to the second communication interface; the first communication interface is electrically connected to the processor and configured to transmit the projection sub-image as the second image to the camera; and the second communication interface is electrically connected to the processor and configured to transmit the display sub-image as the first image to the display screen.

2. The electronic device of claim 1, wherein the image buffer comprises a first buffer and a second buffer;

wherein the first buffer is configured to store the projection sub-image, and the second buffer is configured to store the display sub-image.

3. The electronic device of claim 1, wherein the first communication interface and the second communication interface are display serial interfaces (DSIs) for synchronous transmission.

4. The electronic device of claim 1, wherein the projection assembly comprises a color film layer, a metal wiring layer, a light emitting element, and a driving element;

wherein the driving element is disposed on a surface of a substrate and configured to drive the light emitting element to emit light;

wherein the metal wiring layer is disposed on a surface of the driving element, and is electrically connected to the driving element and the light emitting element;

wherein the light emitting element is disposed on a surface of the metal wiring layer, and is configured to emit light under the driving of the driving element; and wherein the color film layer is disposed on a surface of the light emitting element and configured to filter lights.

5. The electronic device of claim 4, wherein the imaging assembly and the projection assembly share the substrate.

6. The electronic device of claim 5, wherein the imaging assembly comprises a photosensitive element, the metal wiring layer shared with the projection assembly, and the color film layer shared with the projection assembly;

wherein the photosensitive element is disposed on the surface of the substrate, and configured to detect the light filtered by the color film layer; and wherein the metal wiring layer is electrically connected to the photosensitive element.

7. The electronic device of claim 4, wherein light emitting element comprises:

a metal anode disposed on the surface of the metal wiring layer;

an organic polymer light emitting layer disposed on a surface of the metal anode; and a transparent cathode disposed on a surface of the organic polymer light emitting layer.

8. The electronic device of claim 1, wherein the camera comprises a plurality of camera units, each camera unit comprises at least one projection assembly and at least one imaging assembly;

each projection assembly corresponds to a pixel of the second image, and the pixel of the second image is determined according to the second image; and each imaging assembly corresponds to a pixel of the third image, and the pixel of the third image is configured to generate the third image.

9. The electronic device of claim 8, wherein the projection assembly comprises a color film layer, a metal wiring layer, a light emitting element, and a driving element; the driving element is disposed on a surface of a substrate and configured to drive the light emitting element to emit light; the metal wiring layer is disposed on a surface of the driving element, and is electrically connected to the driving element and the light emitting element; the light emitting element is disposed on a surface of the metal wiring layer, and is configured to emit light under the driving of the driving element; and the color film layer is disposed on a surface of the light emitting element and configured to filter lights.

10. The electronic device of claim 9, wherein light emitting element comprises:

a metal anode disposed on the surface of the metal wiring layer;

an organic polymer light emitting layer disposed on a surface of the metal anode; and a transparent cathode disposed on a surface of the organic polymer light emitting layer.

11. An image processing method, comprising:

controlling a camera in a display state or in an imaging state;

obtaining a fourth image;

dividing the fourth image into a display sub-image and a projection sub-image;

transmitting the display sub-image as a first image to a display screen and transmitting the projection sub-image as a second image to the camera;

controlling the camera to project the second image when the camera is in the display state; and controlling the camera to capture a third image when the camera is in the imaging state.

12. The method of claim 11, wherein before transmitting the display sub-image as a first image to the display screen and transmitting the projection sub-image as the second image to the camera, the method further comprises:

storing the projection sub-image in a first buffer, and storing the display sub-image in a second buffer;

reading the projection sub-image from the first buffer, and reading the display sub-image from the second buffer.

13. The method of claim 12, wherein dividing the fourth image into a display sub-image and a projection sub-image comprises:

determining the display sub-image from the fourth image according to image pixels corresponding to a non-light transmission area of the display screen; and determining the projection sub-image from the fourth image according to image pixels corresponding to a light transmission area projected by the camera.

14. The method of claim 11, wherein transmitting the display sub-image as a first image to the display screen and transmitting the projection sub-image as the second image to the camera comprises:

synchronizing a first transmission signal of the display screen and the second transmission signal of the camera, wherein the first transmission signal carries the display sub-image, and the second transmission signal carries the projection sub-image;

transmitting the synchronized first transmission signal to the display screen and transmitting the synchronized second transmission signal to the camera.

15. The method of claim 11, wherein the method is executable for a processing unit of an electronic device, wherein the electronic device comprises the processing unit, the camera, the display screen covering the camera, the camera and the display screen are electrically connected to the processing unit, the display screen comprises a light transmission area and a non-light transmission area, and the camera is disposed under the light transmission area and comprises a projection assembly and an imaging assembly both electrically connected to the processing unit;

wherein the processing unit comprises a first communication interface electrically connected to the camera, a second communication interface electrically connected to the display screen, and the first communication interface and the second communication interface are display serial interfaces (DSIs) for synchronous transmission;

wherein transmitting the display sub-image as a first image to the display screen and transmitting the projection sub-image as the second image to the camera comprises:

transmitting the projection sub-image as the second image to the camera by the first communication interface; and transmitting the display sub-image as the first image to the display screen by the second communication interface.

16. The method of claim 11, wherein the method is executable for a processing unit of an electronic device, wherein the electronic device comprises the processing unit, the camera, the display screen covering the camera, the camera and the display screen are electrically connected to the processing unit, the display screen comprises a light transmission area and a non-light transmission area, and the camera is disposed under the light transmission area and comprises a projection assembly and an imaging assembly both electrically connected to the processing unit;

wherein controlling the camera to project a second image when the camera is in the display state, and controlling the camera to capture a third image when the camera is in the imaging state, comprise:

controlling the projection assembly to project the second image thereby to display the second image on the light transmission area, when the camera is in the display state; and controlling the imaging assembly to capture a third image through the light transmission area when the camera is in the imaging state.

17. The method of claim 16, wherein the projection assembly comprises a color film layer, a light emitting element, and a driving element;

wherein controlling the projection assembly to project the second image comprises:

driving the light emitting element to light by applying a voltage to the light emitting element under a driving signal of the driving element;

filtering the light to generate three primary colors of red, green, and blue when the light passes through the color film layer, to realize a display of the second image according to a color setting of the filter of the color film layer.

18. The method of claim 17, wherein the light emitting element comprises a metal anode, an organic polymer light emitting layer, and a transparent cathode;

wherein the driving the light emitting element to light by applying a voltage to the light emitting element under a driving signal of the driving element, comprises:

applying the voltage to the light emitting element under the driving signal of the driving element;

exciting organic materials of the organic polymer light emitting layer to emit when a current flows from the transparent cathode to the metal anode and passes through the organic polymer light emitting layer.

19. The method of claim 16, wherein the imaging assembly comprises a photosensitive element and a color film layer;

wherein controlling the imaging assembly to capture a third image comprises:

filtering a light when the light passes through the color film layer;

detecting the light filtered by the color film layer by the photosensitive element;

determining R, G, and B value of a pixel of the third image corresponding to the imaging assembly by transferring the detected light from optical information to digital signal by the photosensitive element, to determine the third image.

20. An electronic device, comprising a processing unit, a camera, and a display screen covering the camera;

wherein the display screen is electrically connected to the processing unit, the display screen comprises a light transmission area and a non-light transmission area, and is configured to display a first image on the non-light transmission area under the control of the processing unit;

wherein the camera is disposed under the light transmission area and comprises a projection assembly and an imaging assembly both electrically connected to the processing unit, the projection assembly is configured to project a second image on the display screen thereby to display the second image on the light transmission area of the display screen under the control of the processing unit, and the imaging assembly is configured to capture a third image through the light transmission area of the display screen under the control of the processing unit;

wherein the processing unit is configured to control the display screen to display the first image, and is configured to control the camera to project the second image in a display state and to capture the third image in an imaging state;

wherein the camera comprises a plurality of camera units, each camera unit comprises at least one projection assembly and at least one imaging assembly;

each projection assembly corresponds to a pixel of the second image, and the pixel of the second image is determined according to the second image; and each imaging assembly corresponds to a pixel of the third image, and the pixel of the third image is configured to generate the third image.

* * * * *